(12) United States Patent
Momose et al.

(10) Patent No.: US 7,314,775 B2
(45) Date of Patent: Jan. 1, 2008

(54) IT-CCD AND MANUFACTURING METHOD THEREOF

(75) Inventors: Takaaki Momose, Miyagi (JP); Teiji Azumi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/500,455

(22) Filed: Aug. 8, 2006

(65) Prior Publication Data

US 2006/0270120 A1   Nov. 30, 2006

Related U.S. Application Data

(62) Division of application No. 10/430,308, filed on May 7, 2003, now abandoned.

(30) Foreign Application Priority Data

May 9, 2002 (JP) .............................. 2002-133989

(51) Int. Cl.
*H01L 31/0321* (2006.01)
(52) U.S. Cl. ........................................ 438/78; 438/144
(58) Field of Classification Search .................. 438/78, 438/144
See application file for complete search history.

(56) References Cited

U.S. PATENT DOCUMENTS

| 5,286,669 A | 2/1994 | Maeda et al. |
| 6,090,640 A * | 7/2000 | Ogawa ........................ 438/78 |
| 6,165,908 A | 12/2000 | Hatano et al. |
| 2002/0075391 A1* | 6/2002 | Shizukuishi ................ 348/319 |

FOREIGN PATENT DOCUMENTS

JP    11-31812 A    2/1999

* cited by examiner

*Primary Examiner*—Long Pham
(74) *Attorney, Agent, or Firm*—Birch, Stewart, Kolasch & Birch, LLP

(57) ABSTRACT

The present invention provides a power-thrifty IT-CCD having a charge transfer electrode area thinned for improving the light reception efficiency of a photoelectric conversion section and being capable of executing high-speed and high-sensitivity transfer without lowering withstand voltage between charge transfer electrodes. A first insulation film is formed on the surface of a silicon substrate, and inter-electrode insulation films made of silicon oxide films and charge transfer electrodes made of polycrystalline silicon films are formed on the surface of the first insulation film. The inter-electrode insulation films are formed from side walls of the polycrystalline silicon films.

6 Claims, 5 Drawing Sheets

IT-CCD AND MANUFACTURING METHOD THEREOF

This application is a Divisional of application Ser. No. 10/430,308, filed on May 7, 2003, now abandoned, the entire contents of which are hereby incorporated by reference and for which priority is claimed under 35 U.S.C. § 120.

BACKGROUND OF THE INVENTION

1. Field of the Invention

This invention relates to an Interline CCD (hereinafter IT-CCD) and a manufacturing method thereof and in particular to an IT-CCD and a manufacturing method thereof. Especially, the invention relates to an IT-CCD intended for miniaturization and high quality of an inter-electrode insulation film of charge transfer electrodes of a single-layer structure.

2. Description of the Related Art

An IT-CCD used with an area sensor, etc., has charge transfer electrodes for transferring signal charges from a photoelectric conversion section. The charge transfer electrodes are placed contiguously on a charge transfer passage formed on a semiconductor substrate and driven in order.

The IT-CCD having charge transfer electrodes involves the following problem: With the advance of miniaturization according to the demand for increasing the number of photograph pixels, the area in which incidence light from a slanting direction can be gathered lessens and the sensitivity is degraded. Thus, it is required that any area other than a photoelectric conversion section be thinned as much as possible. Since a light shield film needs to be formed in any area other than the photoelectric conversion section, preferably the area is flattened as much as possible.

Thus, an IT-CCD having single-layer wiring electrodes with charge transfer electrodes placed without being superposed is proposed. The IT-CCD has an inter-electrode insulation film between contiguous charge transfer electrodes, and a silicon-based conductive material such as polycrystalline silicon is used as the material of the charge transfer electrodes.

On the other hand, the IT-CCD requires high-speed transfer of signal charges with upsizing and an increase in the number of pixels. To drive a charge transfer electrode of a single-layer structure with a high-speed pulse, the distance (gap) from the contiguous charge transfer electrode needs to be formed narrow (0.1 μm or less). High withstand voltage is required for insulation between electrodes.

To provide such an electrode pattern, for example, an EB direct drawing method is used on a flat surface; an expensive stepper needs to be used. Even if an electrode pattern can be provided, it is extremely difficult to fill a minute inter-electrode area with an insulating film, also causing withstand voltage to be lowered; it is practically impossible.

It is therefore an object of the invention to provide a power-thrifty IT-CCD having a charge transfer electrode area thinned for improving the light reception efficiency of a photoelectric conversion section and being capable of executing high-speed and high-sensitivity transfer without lowering withstand voltage between charge transfer electrodes. It is another object of the invention to provide a manufacturing method of an easily manufactured and highly reliable IT-CCD.

SUMMARY OF THE INVENTION

To this end, according to one aspect of the invention, there is provided an IT-CCD including a plurality of charge transfer electrodes formed on an insulation film on a surface of a semiconductor substrate, wherein the contiguous charge transfer electrodes are separated by an inter-electrode insulation film and are placed so that they are not superposed on each other, and wherein the inter-electrode insulation film is an insulation film formed from a side wall of one of the contiguous charge transfer electrodes.

This configuration would make it possible to provide a power-thrifty IT-CCD having a charge transfer electrode area thinned for improving the light reception efficiency of a photoelectric conversion section and being capable of executing high-speed and high-sensitivity transfer without lowering withstand voltage between charge transfer electrodes. The surface can also be flattened and to form a wiring structure on the top face, efficient pattern formation is also made possible.

In the IT-CCD of the invention, the spacing between the charge transfer electrodes formed by the inter-electrode insulation film is 0.1 μm or less. If the spacing between the charge transfer electrodes is 0.1 μm or less, it is extremely difficult to fill the space between the electrodes with an insulating film; however, the inter-electrode insulation film is formed from the side wall of one of the contiguous charge transfer electrodes, so that the spacing between the charge transfer electrodes can be made 0.1 μm or less. Therefore, a low-resistance and highly reliable IT-CCD that can also be driven with a high-speed pulse can be provided.

In the IT-CCD of the invention, the charge transfer electrodes are formed so as to become the same surface as the upper end of the inter-electrode insulation film. In doing so, electrode conductor can be filled at the maximum and resistance can be lowered and in addition, the surface can be flattened.

In the IT-CCD of the invention, the charge transfer electrode contains a conductive film made of a silicon-based material.

In the IT-CCD of the invention, the charge transfer electrode is a multi-layer structure film of a silicon-based conductive film made of a silicon-based material and a conductive film containing metal formed on the silicon-based conductive film. In doing so, it is made possible to make lower resistance of the electrode.

In the IT-CCD of the invention, the conductive film contains tungsten. In doing so, resistance can be lowered and a light shield function can be provided by tungsten; it is made possible to provide a highly reliable IT-CCD at low costs.

According to another aspect of the invention, there is provided a manufacturing method of an IT-CCD including a plurality of charge transfer electrodes formed on a first insulation film on a surface of a semiconductor substrate, the manufacturing method including a first conductive film formation step of forming a first conductive film forming at least a part of the charge transfer electrode on the first insulation film; a step of forming an etching stopper layer made of a material having etching selectivity for a material forming the first conductive film on the first conductive film; a step of patterning the first conductive film and the etching stopper layer by photolithography to form a two-layer structure pattern of the first conductive film and the etching stopper layer; a step of forming a second insulation film on the whole substrate surface so as to cover the two-layer structure pattern; a side wall insulation film formation step of anisotropically etching the second insulation film in a vertical direction so as to leave the second insulation film only on side walls of the two-layer structure pattern; a second conductive film formation step of forming on the insulation film a second conductive film forming at least a part of the charge transfer electrode so as to cover the whole two-layer structure pattern until the surface becomes flat; an etching-back step of etching back the second conductive film until the etching stopper layer is exposed; and an etching stopper layer removal step of removing the etching stopper layer.

According to the method, anisotropic etching is used to form inter-electrode insulation film on the side walls of the charge transfer electrodes formed at intervals of two, so that a minute and highly reliable IT-CCD can be easily formed. The inter-electrode insulation film is formed in a self-alignment manner as side wall insulation film rather than formed directly by thermal oxidation, and thus can be formed at low temperature and in addition, need not be buried in a pattern of a minute width or a minute groove exceeding the resolution limit.

In the manufacturing method of the invention, the side wall insulation film formation step includes a step of performing anisotropic etching with the first insulation film as an etching stopper. Thus, anisotropic etching is performed with the first insulation film on the substrate surface as an etching stopper, so that a decrease in the thickness of the first insulation film is prevented, making it possible to prevent degradation of the withstand voltage characteristic.

In the manufacturing method of the invention, the first or second conductive film uses a polycrystalline silicon film.

In the manufacturing method of the invention, the etching-back step is executed by chemical polishing (CMP).

In the manufacturing method of the invention, the second insulation film uses a silicon oxide film. Since the silicon oxide film does not contain conductive impurities, withstand voltage can be raised even in small thickness.

The manufacturing method of the invention further includes an etching step of etching surfaces of the first and second conductive films to a position lower than the upper end of the side wall insulation film; a metal film formation step of forming a metal film on the whole surface; and a flatting step of etching back the metal film until the top face of the side wall insulation film is exposed and flatting the surface after the etching stopper layer removal step.

To form the conductive film of a polycrystalline silicon film, etc., it is difficult to decrease the resistance value, but the method enables a metal film to be easily deposited on the top layer, making it possible to form low-resistance and highly reliable charge transfer electrodes.

Thus, according to the invention, using anisotropic etching, the insulation films formed on the side walls of the first-layer charge transfer electrodes are made the inter-electrode insulation films and second-layer charge transfer electrode is formed therebetween, so that the surface can be flattened, the height of the device can be decreased, the working margins in the photolithography and etching steps are widened, and it is made possible to provide IT-CCDs at a high yield without using semiconductor manufacturing equipment such as an expensive stepper. Since the high-quality insulation films are used as the inter-electrode insulation films, the withstand voltage can be improved and the yield can be enhanced. Further, insulation material need not be buried in the inter-electrode area of a minute width, lowering of the withstand voltage can be prevented, and it is made possible to enhance the yield.

Figure 1A:
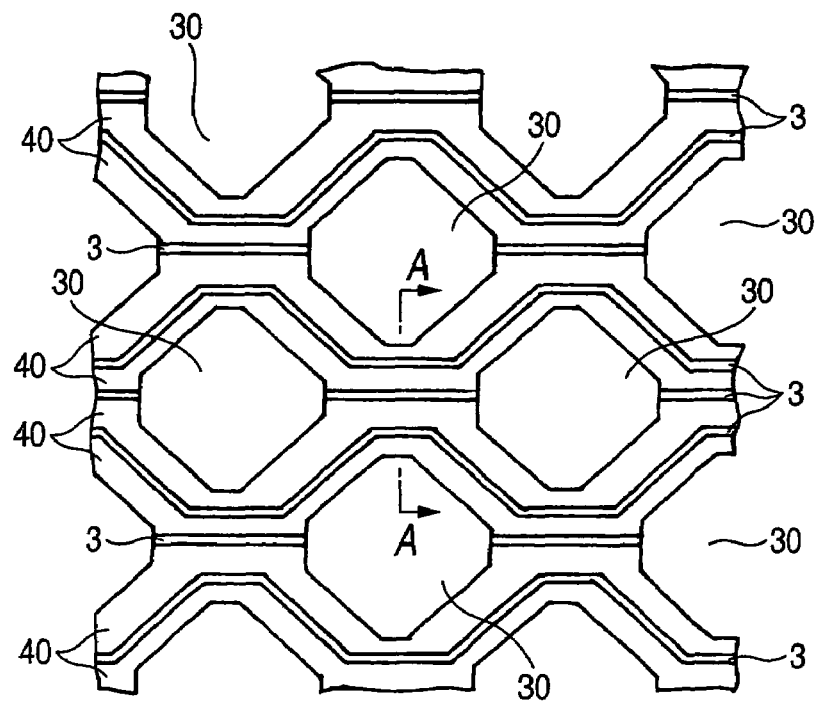
FIGS. 1A and 1B are drawings to show a schematic configuration of an IT-CCD of a first embodiment of the invention.

In the drawings, the reference numeral 1 to a silicon substrate; 2 to a first insulation film (gate insulation film); 3a to a second insulation film (silicon oxide film); 3 to an inter-electrode insulation film; each of 4a and 4b to a polycrystalline silicon film; each of 5a, 5b, and 5 to a Tungsten film; 6 to a silicon oxide film; 30 to a photodiode; 31 to a channel stop area; 40 to a charge transfer electrode; and 50 to a light shield film.

DETAILED DESCRIPTION OF THE PREFERRED EMBODIMENTS

Referring now to the accompanying drawings, there are shown preferred embodiments of the invention.

First Embodiment

Figure 1B:
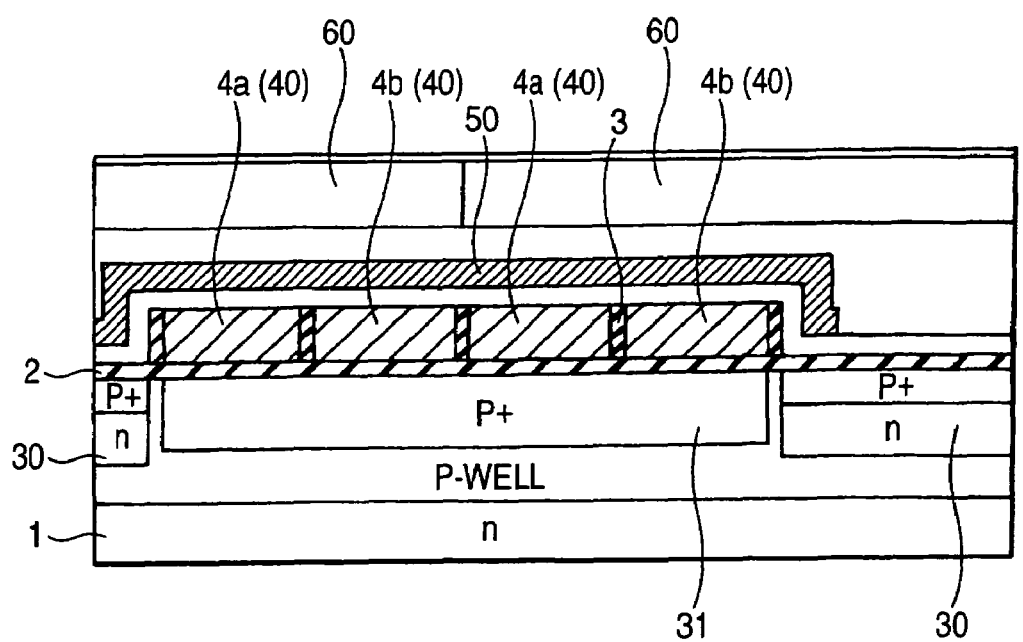

FIGS. 1A and 1B shows a schematic configuration of an IT-CCD of a first embodiment of the invention. FIG. 1A is a schematic plan view to show charge transfer electrodes and other parts of the IT-CCD, and FIG. 1B is a sectional view taken on line A-A in FIG. 1B. As shown in FIGS. 1A and 1B, in a silicon substrate 1, a plurality of photodiodes 30 are formed and charge transfer electrodes 40 for transferring signal charges detected by the photodiodes are formed so as to show a meandering shape among the photodiodes 30. Charge transfer channels (not shown) where the signal charges transferred by the charge transfer electrodes 40 move are also formed so as to show a meandering shape in a direction crossing the direction in which the charge transfer electrodes 40 are extended. In FIG. 1A, inter-electrode insulation films 3 formed in the proximity of the boundary between the photodiode area and the charge transfer electrodes 40 are not shown.

As shown in FIG. 1B, the photodiodes 30, the charge transfer channels (not shown), channel stop areas 31, and charge read areas (not shown) are formed in the silicon substrate 1, and insulation films (gate insulation films) 2 are formed on the surface of the silicon substrate 1. Inter-electrode insulation films 3 made of silicon oxide films and the charge transfer electrodes 40 made of polycrystalline silicon films 4a and 4b are formed on the surface of the gate insulation film 2. The inter-electrode insulation film 3 is formed from a side wall of either of the polycrystalline silicon films 4a and 4b, for example, the polycrystalline silicon film 4a.

In an upper portion of the IT-CCD, a light shield film 50 is placed except for the photodiode 30 portion and further a color filter 60 and a microlens (not shown) are placed. The space between the charge transfer electrode 40 and the light shield film 50 and the space between the light shield film 50 and the color filter 60 are filled with an insulation substance. The parts except the charge transfer electrodes 40 or the inter-electrode insulation films 3 are similar to those in a related art and therefore will not be discussed. FIGS. 1A and 1B show the IT-CCD of a honeycomb structure, but the invention can also be applied to an IT-CCD of an interline type, needless to say.

Figure 2A:
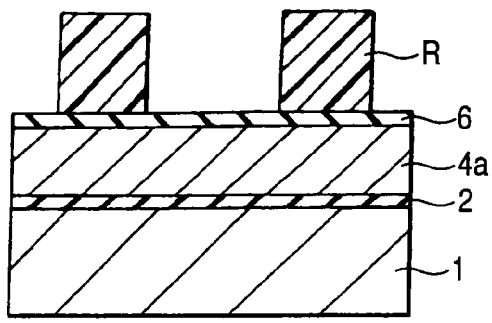
FIGS. 2A to 2F are drawings to show a manufacturing process of the IT-CCD of the first embodiment of the invention.

Next, a manufacturing process of the IT-CCD will be discussed with FIGS. 2A to 2F. To begin with, as shown in FIG. 2A, a silicon oxide film 15 nm thick, a silicon nitride film 50 nm thick, and a silicon oxide film 10 nm thick are formed on the surface of an n-type silicon substrate 1 to form a gate insulation film 2 of a three-layer structure. Subsequently, a low-pressure CVD method using a gas mixture of $SiH_4$ and $PH_3$ diluted with He is used to form a polycrystalline silicon film 4a doped at high concentration 0.4 μm thick on the gate insulation film 2. The substrate temperature at this time is 600° C. to 700° C. Subsequently, a silicon oxide film 6 used as an etching stopper layer is formed using low-pressure CVD method, and a coat of a resist called THMR manufactured by Tokyou Ouka is applied in thickness of 0.8 to 1.4 μm onto the silicon oxide film 6.

Using photolithography, with any desired mask, exposure to light is executed and developing and water washing are performed to form a resist pattern R having a pattern width of 0.5 μm. At this time, the resolution limit was 0.5 μm.

Figure 2B:
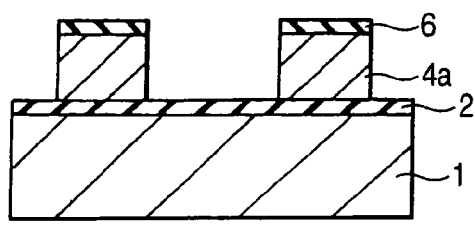

After this, as shown in FIG. 2B, the polycrystalline silicon film 4a and the silicon oxide film 6 are selectively etched and removed with the resist pattern R as a mask and with the gate insulation film 2 as an etching stopper by reactive ion etching using a gas mixture of HBr and $O_2$ and then the resist pattern R is stripped off. Here, it is desirable that an etching apparatus of ECR, ICP, or the like should be used.

Figure 2C:
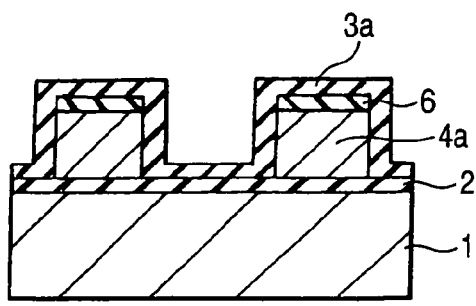

Subsequently, as shown in FIG. 2C, a low-pressure CVD method using a gas mixture of TEOS and $O_2$ is used to form a second insulation film 3a made of a silicon oxide film 30 nm thick.

Figure 2D:
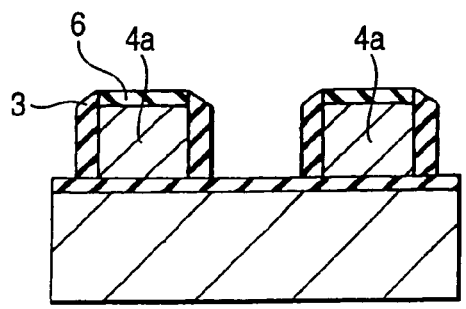

As shown in FIG. 2D, etching is advanced only in the vertical direction as anisotropic etching and etching is performed so as to leave the second insulation film (silicon oxide film) 3a only on side walls of the polycrystalline silicon film 4a to form inter-electrode insulation films 3 made of side wall insulation films.

Figure 2E:
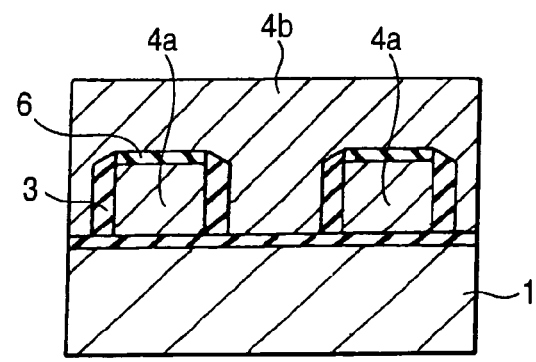

Next, as shown in FIG. 2E, a low-pressure CVD method using a gas mixture of $SiH_4$ and $PH_3$ is used to form a polycrystalline silicon film 4b doped at high concentration 0.4 to 1.4 μm thick.

Figure 2F:
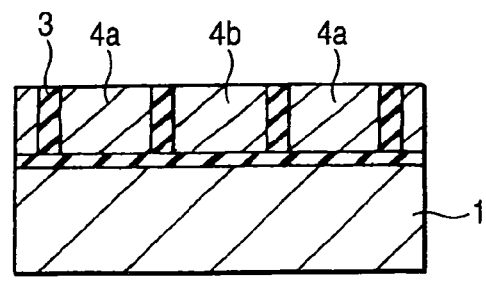

As shown in FIG. 2F, the substrate surface is polished by CMP (chemical polishing) and further chemical etching is performed until the top faces of the inter-electrode insulation films 3 are exposed, and charge transfer electrodes made up of the polycrystalline silicon films 4a and 4b are separated. An insulation film, a light shield film, and the like are formed on the top layer to provide an IT-CCD as shown in FIG. 1.

According to the method, when the insulation film pattern as the inter-electrode insulation films is formed, minute and highly reliable inter-electrode insulation films are easily formed by leaving the side walls using the anisotropic etching. Therefore, it is made possible to form an IT-CCD having minute inter-electrode insulation films smaller than the resolution limit.

Second Embodiment

Next, a second embodiment of the invention will be discussed. In the first embodiment, the conductive layer of the charge transfer electrode is formed of one layer of polycrystalline silicon film; in the second embodiment, a two-layer structure formed with a conductive film containing metal on the surface is adopted to make low resistance of charge transfer electrode.

Figure 3:
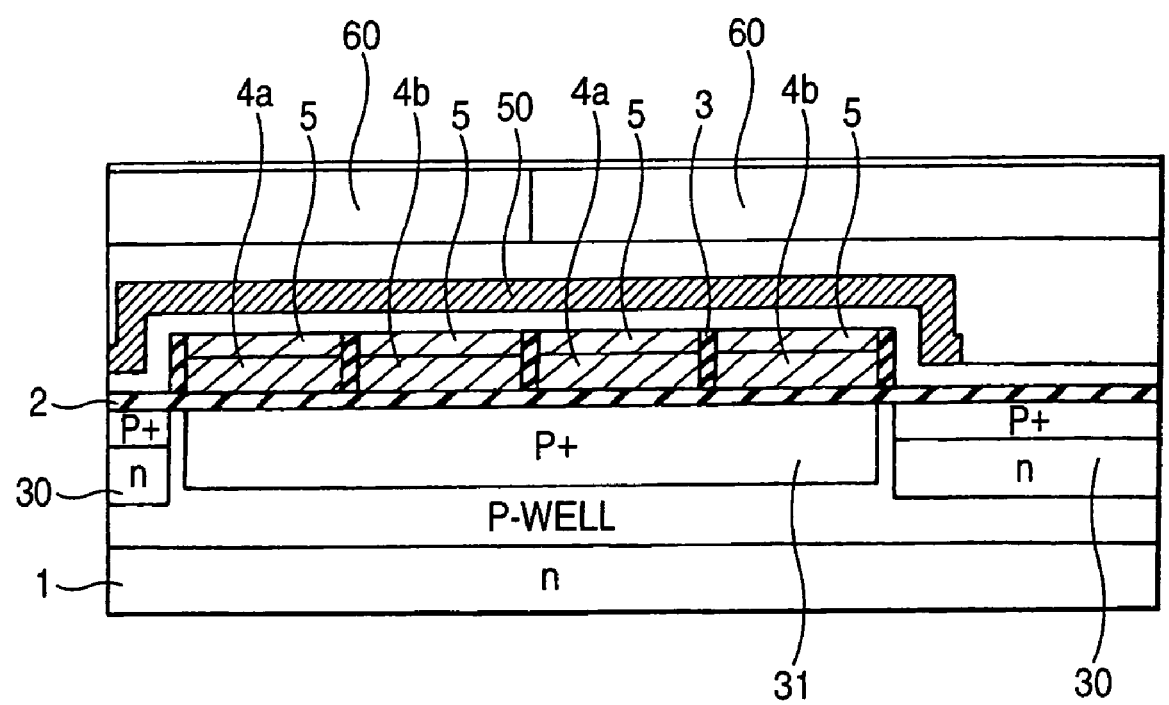
FIG. 3 is a drawing to show a schematic configuration of an IT-CCD of a second embodiment of the invention.

FIG. 3 shows a schematic configuration of an IT-CCD of the second embodiment of the invention. It is a sectional view corresponding to FIG. 1A. Conductive films of tungsten films 5, etc., are deposited on polycrystalline silicon films 4a and 4b. As the conductive films, tungsten silicide, tantalum, titanium, molybdenum, nickel, silicide thereof, aluminum, etc., may be used. Other parts are similar to those of the IT-CCD previously described with reference to FIG. 1 and therefore will not be discussed again.

FIGS. 4A to 4H are drawings to show a manufacturing process of the IT-CCD of the second embodiment. FIGS. 4A to 4E are similar to FIGS. 2A to 2E to show the manufacturing process of the IT-CCD of the first embodiment and therefore will not be discussed again.

Figure 4A:
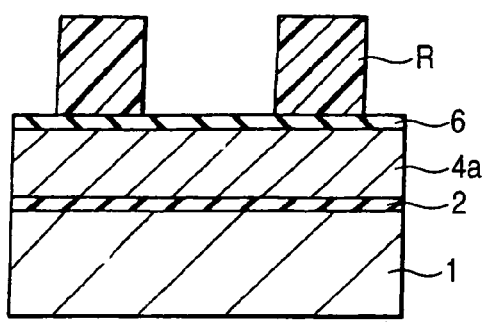
FIGS. 4A to 4H are drawings to show a manufacturing process of the IT-CCD of the second embodiment of the invention.
Figure 4B:
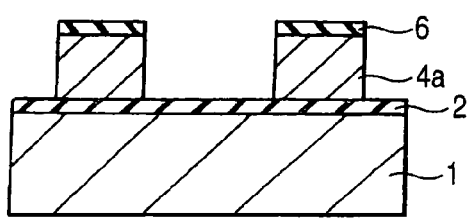
Figure 4C:
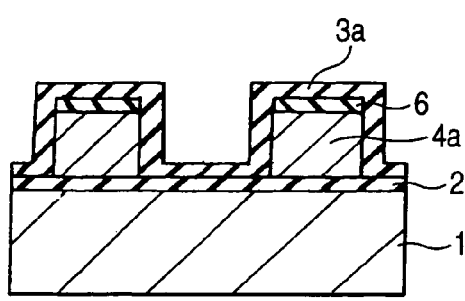
Figure 4D:
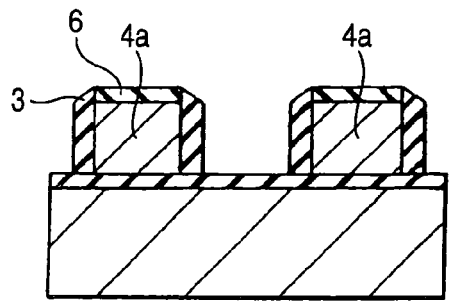
Figure 4E:
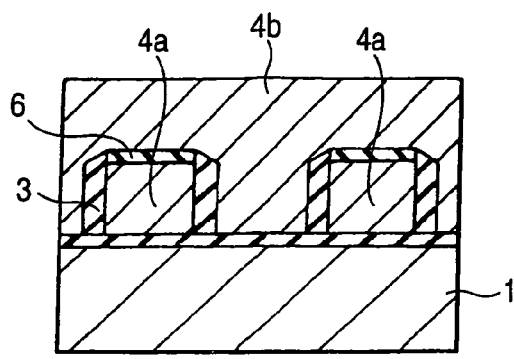
Figure 4F:
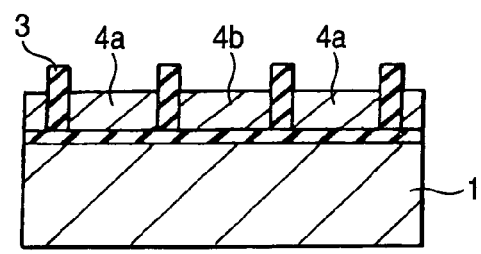
Figure 4G:
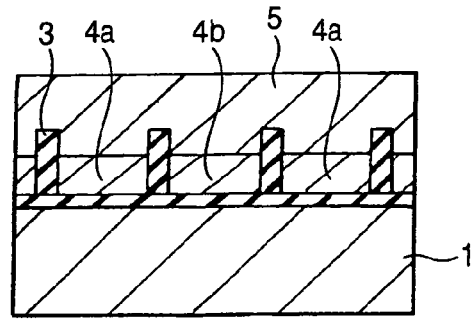

As shown in FIG. 4F, surfaces of polycrystalline silicon films 4a and 4b are etched and removed by reactive ion etching using a gas mixture of HBr and $O_2$ and the tops of inter-electrode insulation films 3 are exposed until positions lower than the upper end face. As shown in FIG. 4G, a low-pressure CVD method using $WF_6$ and $H_2$ is used to form a tungsten film 5 500 to 600 nm thick on the polycrystalline silicon films 4a and 4b. The substrate temperature at this time was 500° C. At this time, the substrate surface is flat without asperities.

Figure 4H:
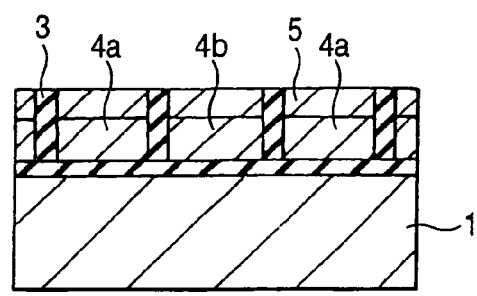

Subsequently, as shown in FIG. 4H, reactive ion etching using a gas mixture of $CF_4$ and $O_2$ is performed so that the top faces of the inter-electrode insulation films 3 are exposed and the substrate surface becomes flat, and charge transfer electrodes made up of the polycrystalline silicon films 4a and 4b and the tungsten film 5 are separated. An insulation film, a light shield film, and the like are formed on the top layer to provide an IT-CCD as shown in FIG. 3. In this case, the tungsten film 5 has a thickness to the extent to which it provides a sufficient light shield effect, whereby the light shield film can also be omitted.

Third Embodiment

Next, a third embodiment of the invention will be discussed. In the first and second embodiments, the silicon oxide film 6 is used as the etching stopper layer for masking or etching-back to pattern the polycrystalline silicon films 4a, but the etching stopper layer is not limited to the silicon oxide film and may be a silicon nitride film or a metal film such as a chromium thin film. It may be any if it is a material having etching selectivity with the polycrystalline silicon film of the lower layer and the polycrystalline silicon film of the upper layer.

Fourth Embodiment

Next, a fourth embodiment of the invention will be discussed. In the second embodiment, the surfaces of the polycrystalline silicon films 4a and 4b are removed to the positions lower than the upper end face of the inter-electrode insulation film 3 and then the tungsten film 5 is formed on the polycrystalline silicon films 4a and 4b; in the fourth embodiment, polycrystalline silicon films 4a and 4b are formed and then tungsten films 5a and 5b are formed.

Figure 5A:
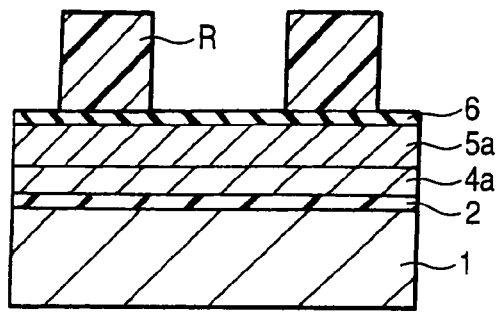
FIGS. 5A to 5F are drawings to show a manufacturing process of an IT-CCD of a fourth embodiment of the invention.

Next, a manufacturing process of an IT-CCD of the fourth embodiment will be discussed with FIGS. 5A to 5F. To begin with, as shown in FIG. 5A, a silicon oxide film 15 nm thick, a silicon nitride film 50 nm thick, and a silicon oxide film 10 nm thick are formed on the surface of an n-type silicon substrate 1 to form a gate insulation film 2 of a three-layer structure. Subsequently, a low-pressure CVD method using a gas mixture of $SiH_4$ and $PH_3$ is used to form a polycrystalline silicon film 4a doped at high concentration 0.4 μm thick on the gate insulation film 2 and further a CVD method using $WF_6$ is used to form a tungsten film 5a. The substrate temperature at this time is 500° C.

Subsequently, a silicon oxide film 6 is formed using low-pressure CVD method, and a coat of a resist called FDUR manufactured by Tokyou Ouka is applied in thickness of 0.8 to 1.4 μm onto the silicon oxide film 6. Using photolithography, with any desired mask, exposure to light is executed and developing and water washing are performed to form a resist pattern R having a pattern width of 0.35 μm. At this time, the resolution limit was 0.35 μm.

Figure 5D:
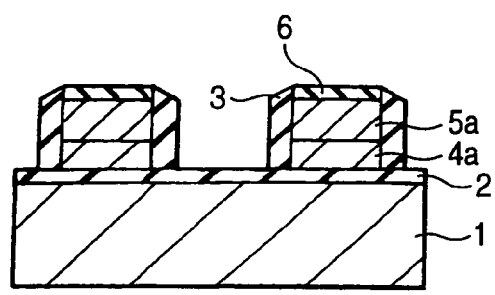
Figure 5B:
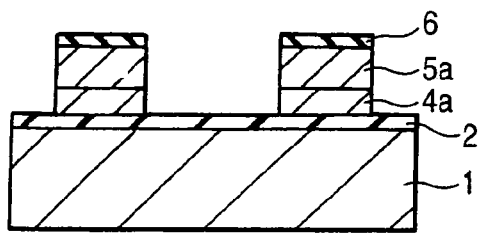

After this, as shown in FIG. 5B, the silicon oxide film 6 and the tungsten film 5a are patterned with the resist pattern R as a mask by reactive ion etching using a gas mixture of $Cl_2$ and $O_2$ and then the polycrystalline silicon film 4a is selectively etched and removed with the gate insulation film 2 as an etching stopper and further the resist pattern R is stripped off. Here, it is desirable that an etching apparatus of ECR, ICP, or the like should be used.

Figure 5E:
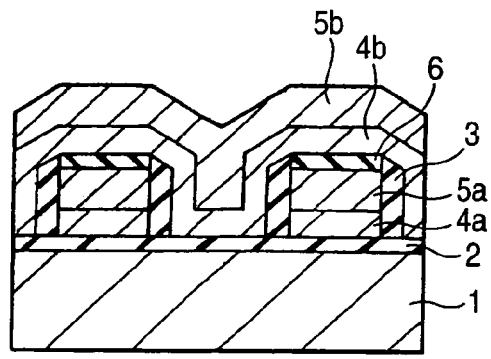
Figure 5C:
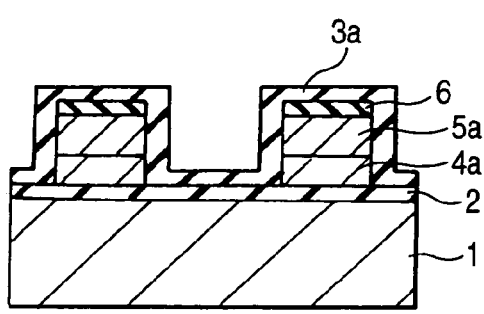

Subsequently, as shown in FIG. 5C, a low-pressure CVD method using a gas mixture of TEOS and $O_2$ is used to form a third insulation film 3a made of a silicon oxide film 30 nm thick.

As shown in FIG. 5D, etching is advanced only in the vertical direction as anisotropic etching and etching is performed so as to leave the third insulation film 3a only on side walls of the polycrystalline silicon film 4a and the tungsten film 5a to form inter-electrode insulation films 3 made of side wall insulation films.

Figure 5F:
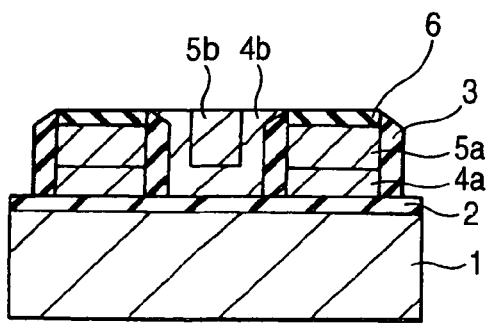

Subsequently, as shown in FIG. 5E, a CVD method using a gas mixture of $SiH_4$ and $PH_3$ is used to form a polycrystalline silicon film 4b doped at high concentration 0.3 μm thick and further a CVD method using $WF_6$ is used to form a tungsten film 5b. As shown in FIG. 5F, anisotropic etching is performed until the second insulation film 6 is exposed by etching-back.

A tungsten silicide film may be used in place of the tungsten film 5a, 5b in the fourth embodiment. Tantalum, titanium, molybdenum, nickel, silicide thereof, aluminum, etc., can also be used.

As described above, according to the invention, it is made possible to provide a power-thrifty IT-CCD having a charge transfer electrode area thinned for improving the light reception efficiency of a photoelectric conversion section and being capable of executing high-speed and high-sensitivity transfer without lowering withstand voltage between charge transfer electrodes. As resistance of the charge transfer electrodes is lowered, the electrode height can be furthermore lowered and the surface can be flattened, so that it is made possible to decrease optical characteristic failure caused by level difference, such as inconsistencies in color.

Further, since high-speed transfer is made possible, optical characteristics of smear, etc., can be improved and it is made possible to provide a high-quality and highly reliable CCD.

According to the manufacturing method of the IT-CCD of the invention, highly reliable IT-CCDs can be manufactured easily.

What is claimed is:

1. A manufacturing method of an IT-CCD including a plurality of charge transfer electrodes formed on a first insulation film on a surface of a semiconductor substrate, said manufacturing method comprising the steps of:
    first conductive film forming for forming a first conductive film which forms at least a part of the charge transfer electrode on the first insulation film;
    etching stopper layer forming for forming an etching stopper layer made of a material having etching selectivity for a material forming the first conductive film on the first conductive film;
    two-layer patterning for patterning the first conductive film and the etching stopper layer by photolithography to form a two-layer structure pattern of the first conductive film and the etching stopper layer;
    second insulation film forming for forming a second insulation film on the whole substrate surface so as to cover the two-layer structure pattern;
    side wall insulation film forming for anisotropic etching the second insulation film in a vertical direction so as to leave the second insulation film only on side walls of the two-layer structure pattern;
    second conductive film forming for forming on the insulation film a second conductive film forming at least a part of the charge transfer electrode so as to cover the whole two-layer structure pattern until the surface becomes flat;
    etching-back for etching back the second conductive film until the etching stopper layer is exposed; and
    etching stopper layer removing for removing the etching stopper layer.

2. The manufacturing method according to claim 1, wherein said step of side wall insulation film forming includes a step of performing anisotropic etching with the first insulation film as an etching stopper.

3. The manufacturing method according to claim 1, wherein the first or second conductive film is a polycrystalline silicon film.

4. The manufacturing method according to claim 1, wherein said etching-back step is executed by CMP.

5. The manufacturing method according to claim 1, wherein the second insulation film is a silicon oxide film.

6. The manufacturing method according to claim 1, further comprising the steps of:
    etching for etching surfaces of the first and second conductive films to a position lower than the upper end of the side wall insulation film;
    metal film forming for forming a metal film on the whole surface; and
    flatting for etching back the metal film until the top face of the side wall insulation film is exposed and flatting the surface after the step of etching stopper layer removing.

* * * * *